(12) United States Patent
Ye

(10) Patent No.: US 11,239,321 B2
(45) Date of Patent: *Feb. 1, 2022

(54) GAN LATERAL VERTICAL HJFET WITH SOURCE-P BLOCK CONTACT

(71) Applicant: Gangfeng Ye, Fremont, CA (US)

(72) Inventor: Gangfeng Ye, Fremont, CA (US)

(73) Assignee: Gangfeng Ye, Fremont, CA (US)

(*) Notice: Subject to any disclaimer, the term of this patent is extended or adjusted under 35 U.S.C. 154(b) by 4 days.

This patent is subject to a terminal disclaimer.

(21) Appl. No.: 16/705,786

(22) Filed: Dec. 6, 2019

(65) Prior Publication Data

US 2020/0119148 A1 Apr. 16, 2020

Related U.S. Application Data

(63) Continuation of application No. 15/882,017, filed on Jan. 29, 2018, now Pat. No. 10,535,740.

(60) Provisional application No. 62/451,715, filed on Jan. 28, 2017.

(51) Int. Cl.
| | |
|---|---|
| *H01L 29/808* | (2006.01) |
| *H01L 29/205* | (2006.01) |
| *H01L 29/778* | (2006.01) |
| *H01L 29/20* | (2006.01) |
| *H01L 29/66* | (2006.01) |
| *H01L 29/06* | (2006.01) |
| *H01L 29/10* | (2006.01) |

(52) U.S. Cl.
CPC ...... *H01L 29/2003* (2013.01); *H01L 29/0646* (2013.01); *H01L 29/1066* (2013.01); *H01L 29/205* (2013.01); *H01L 29/66462* (2013.01); *H01L 29/66916* (2013.01); *H01L 29/7788* (2013.01); *H01L 29/7789* (2013.01); *H01L 29/8083* (2013.01)

(58) Field of Classification Search
CPC ........ H01L 29/2003; H01L 29/66893–66924; H01L 29/0646; H01L 29/1066; H01L 29/66462; H01L 29/66916; H01L 21/0254; H01L 21/02458; H01L 29/7788; H01L 29/8083
See application file for complete search history.

(56) References Cited

U.S. PATENT DOCUMENTS

| | | | |
|---|---|---|---|
| 10,971,587 B2 * | 4/2021 | Ye | H01L 29/2003 |
| 2014/0045306 A1 | 2/2014 | Bour et al. | 438/192 |
| 2014/0191242 A1 | 7/2014 | Nie et al. | 257/76 |

(Continued)

*Primary Examiner* — Eric A. Ward
(74) *Attorney, Agent, or Firm* — Helen Mao; Imperium Patent Works

(57) ABSTRACT

A vertical JFET is provided. The JFET is mixed with lateral channel structure and p-GaN gate structure. The JFET has an improved barrier layer for p-GaN block layer and enhanced Ohmic contact with source. In one embodiment, regrowth of lateral channel is provided so that counter doping surface Mg will be buried. In another embodiment, a dielectric layer is provided to protect p-type block layer during the processing, and later make Ohmic source and p-type block layer. Method of a barrier regrown layer for enhanced lateral channel performance is provided where a regrown barrier layer is deposited over the drift layer. The barrier regrown layer is an anti-p-doping layer. Method of a patterned regrowth for enhanced Ohmic contact is provided where a patterned masked is used for the regrowth.

13 Claims, 5 Drawing Sheets

(56) References Cited

U.S. PATENT DOCUMENTS

2017/0236951 A1   8/2017  Sun et al. ................. 257/76
2018/0097081 A1*  4/2018  Cao ................. H01L 21/28264
2018/0219072 A1   8/2018  Ye et al.
2018/0350917 A1* 12/2018  Ujita ............... H01L 21/823487

* cited by examiner

GAN LATERAL VERTICAL HJFET WITH SOURCE-P BLOCK CONTACT

CROSS REFERENCE TO RELATED APPLICATIONS

This application is a continuation, and claims priority under claims priority under 35 U.S.C. § 120 from nonprovisional U.S. patent application Ser. No. 15/882,017, entitled "GaN LATERAL VERTICAL HJFET WITH SOURCE-P BLOCK CONTACT," filed on Jan. 29, 2018, the subject matter of which is incorporated herein by reference. Application Ser. No. 15/882,017, in turn claims priority under 35 U.S.C. § 119 from U.S. Provisional Application No. 62/451,715 entitled "GaN LATERAL VERTICAL HJFET WITH SOURCE-P BLOCK CONTACT," filed on Jan. 28, 2017, the subject matter of which is incorporated herein by reference.

TECHNICAL FIELD

The present invention relates generally to semiconductor devices, in particular to GaN Lateral Vertical junction field effect transistor (JFET) with source-P Block contact.

BACKGROUND

Significant progress has been made in the research and development of next generation semiconductor devices. JFET is promising for high power and high temperature applications. Vertical JFET on bulk GaN with vertical drift region has been demonstrated. However, there are several issues. One issue is that source and p-type block layer typically not Ohmic. It would affect switch behavior and long-term reliability. The second issue is that regrowth of lateral and vertical channel often is high resistive due to counter doping during the regrowth.

Both issues affect the reliability and performance of the JFET. Improvement and enhancement are desired for JFET for an improved Ohmic contact and less resistive lateral channel layer.

SUMMARY

In one novel aspect, a vertical JFET is provided. The JFET is mixed with lateral channel structure and p-GaN gate structure. The JFET has improved barrier layer for p-GaN block layer and enhanced Ohmic contact with source. In one embodiment, regrowth of lateral channel is provided so that counter doping surface Mg will be buried. In another embodiment, a dielectric layer is provided to protect p-type block layer during the processing, and later make Ohmic source and p-type block layer.

In one novel aspect, a JFET is provided with a drain metal deposited over a backside of an N substrate, an n-type drift layer epitaxial grown over a topside of the N substrate, a buried P-type block layer deposited over the n-type drift layer, wherein the buried P-type block layer has cut through trenches, a first regrown N-type layer deposited on top of the buried P-type block layer with a contact gap, wherein the first regrown N-type layer forms a barrier layer, and a second regrown layer deposited over the first regrown N-type layer adopted to fill the cut through trenches and form a lateral channel. In one embodiment, the first regrown N-type layer is an anti-p-doping layer. The second regrown layer is an aluminum gallium nitride (AlGaN)/gallium nitride (GaN) layer. In another embodiment, the JFET further comprises a second p-type layer over the second regrown layer with a defined gate length, gate metals deposited over the second p-type layer, and a gate metal over the P-type block layer filling the contact gap of the first regrown N-type layer and the second regrown layer. In one embodiment, the contact gap over the buried P block layer is formed by a patterned regrown process using a regrowth mask.

In another novel aspect, method of a barrier regrown layer for enhanced lateral channel performance is provided. A process comprises as-growing epitaxial layers on top of a N+ gallium nitride (GaN) substrate, wherein an N-type GaN drift layer is grown over the N+ substrate layer, and a P-type block layer is grown over the N-type GaN drift layer, re-growing a first N-type regrown layer over the P-type block layer, wherein the first N-type regrown layer encapsulates the P-type block layer and surface dopant, etching trenches through the first N-type regrown layer and the P-type block layer, and re-growing a second regrown layer over the first N-type regrown layer and in the trench to form an N-type channel and an AlGaN/GaN 2D Gas channel. In one embodiment, the first regrown N-type layer is an anti-p-doping layer.

In yet another novel aspect, method of a patterned regrowth for enhanced Ohmic contact is provided. A process comprises as-growing epitaxial layers on top of a N+ GaN substrate, wherein an N-type GaN drift layer is grown over the N+ substrate layer, and a P-type block layer is grown over the N-type GaN drift layer, and re-growing one or more regrown layers over the P-type block layer with a patterned regrown.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
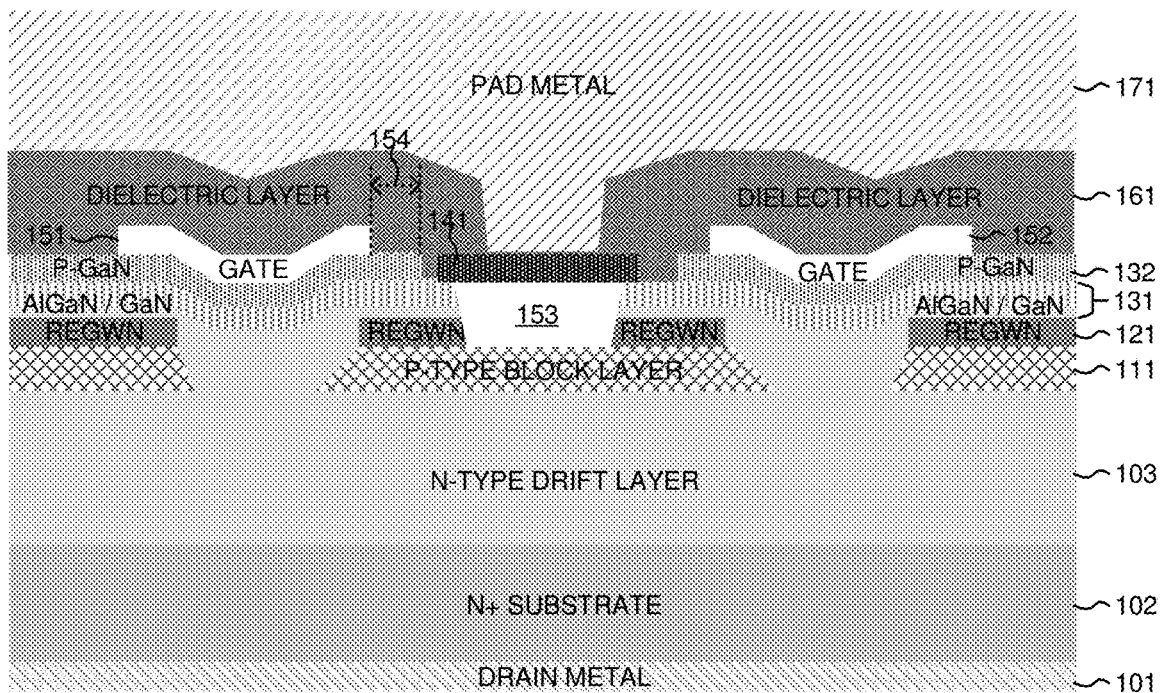
FIG. 1 is simplified exemplary cross-sectional diagram of a lateral vertical HJFET with source-P block contact in accordance with embodiments of the current invention.

FIG. 1 is simplified exemplary cross-sectional diagram of a lateral vertical HJFET with source-P block contact in accordance with embodiments of the current invention. The vertical HJFET has a drain metal 101 attached to the backside of a substrate 102. In one embodiment, substrate 102 is an N+ substrate. In one embodiment, substrate 102 has a dimensional height in the range of 50-100 μm thinning. In another embodiment, substrate 102 has a dimensional height in the range of less than 300 μm. An N-type drift layer 103 deposited over substrate 102. In one embodiment, N-type drift layer 103 is an N-type gallium nitride (GaN) drift layer. In one embodiment substrate 102 and drift layer 103 are epitaxially as-grown. Drift layer 103 has a dimensional height in the range of 6-20 μm. In one embodiment, drift layer 103 has a height around 2 μm for possible low voltage punch through devices. In another embodiment, drift layer 103 has a height around 40 μm for high voltage punch through devices. A P-type block layer 111 is deposited over N-type drift layer 103. P-type block layer 111 is atop drift layer 103. P-type block layer 111 is trenched with trench regions. P-type block layer is doped with p to form a block layer.

In one novel aspect, a regrown barrier layer 121 is deposited over P-type block layer 103. In the traditional JFET, the regrowth of the lateral layer and the vertical channel is high resistive due to the counter doping during the regrowth. During the regrowth, drift layer spills over to the regrown layer resulting in counter doping in the regrown layer. In one embodiment, regrown layer 121 is an anti-p-doping layer that blocks the counter doping to the lateral layer and the vertical channel. Regrown layer 121 buries counter doping surface magnesium (Mg) in the regrown layer 121 so the lateral channel is less resistive. A lateral layer 131 is deposited over the regrown layer 121. In one embodiment, lateral layer 131 is formed by regrowth in the trenches of p-layer 111 and on top of regrown layer 121. Lateral layer 131 forms n-type channel and an AlGaN/GaN 2D Gas channel. A top gate layer 132 is deposited over the lateral layer 131. In one embodiment, top gate layer 132 is a p-GaN gate. In another embodiment, the gate layer 132 is an dielectric layer. In yet another embodiment, gate layer 132 can be other variations known to one ordinary skills in the art. Gate layer 132 is etched to have a predefined gate length 154. Metal gate 151 and metal gate 152 are attached to the top of the gate layer 132. Ohmic contact 153 is formed to attach to the top surface of P-type block layer 103 through a contact gap created during the re-grown process.

In one novel aspect, contact gap to the top surface of p-type block 103 is created using patterned regrowth instead of the traditional etching process. In one embodiment, an island dielectric layer is deposited as regrowth mask before the regrowth process. The contact gap is later created by etching the dielectric material after regrown the lateral channel layer. The result is Ohmic contact 153 is an enhanced Ohmic contact with p-layer 103. A source gate 141 is deposited over Ohmic contact 153 and lateral channel layer 131. In one embodiment, source gate 141 is metal and alloy. A dielectric layer 161 is deposited encapsulating gate layer 132, gates 151 and 152, and part of source gate 141, leaving a trench cut through to part of source gate 141. A pad metal layer 171 is deposited over dielectric layer 161 and the trench cut through in contact with source gate 141.

The overall structure is adopted to optimize the JFET performance. Such structure is achieved with improvement of process.

Figure 2:
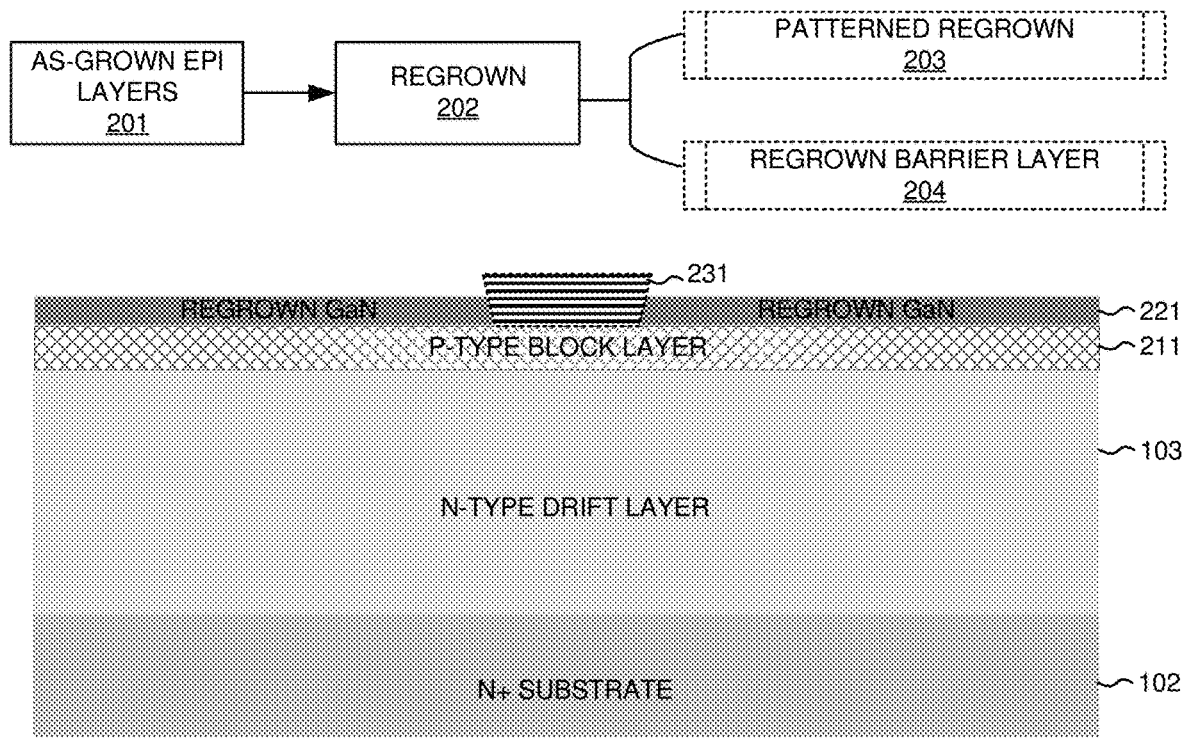
FIG. 2 illustrates exemplary diagrams of a regrown process in accordance with embodiments of the current invention.

FIG. 2 illustrates exemplary diagrams of a regrown process in accordance with embodiments of the current invention. At step 201, EPI layers are created through as-grown process. As shown, substrate 102 has a topside. In one embodiment, substrate 102 is N+ substrate. In one embodiment, substrate 102 is epitaxial grown to a dimensional height in the range of 50-100 μm thinning. In another embodiment, substrate 102 has a dimensional height in the range of less than 300 μm. As-grown epitaxial (EPI) layers are grown over the topside of substrate 102. The EPI layers include the N-type drift layer 103 and p-type block layer 211. In one embodiment, N-type drift layer 103 is epitaxial grown to a dimensional height in the range of 6-20 μm. In one embodiment, drift layer 103 has a height around 2 μm for possible low voltage punch through devices. In another embodiment, drift layer 103 has a height around 40 μm for high voltage punch through devices. At this step, p-type block layer 211 encapsulate n-type drift layer 103. Subsequently, at step 202, a regrown process is performed to form a lateral channel layer.

In one novel aspect, the regrowth is a patterned regrown 203. An island regrowth mask 231 is deposited over p-type block layer 211. Regrowth mask 231 covers the contact region on top of p-type block layer 211. The contact region covered by regrowth mask 231 is subsequently deposited with contact metal to create improved Ohmic contact with the source. In one embodiment, regrowth mask 231 has a height higher than the first regrown layer. In another embodiment, regrowth mask 231 has a height the same or smaller than the first regrown layer. In one embodiment, regrowth mask 231 is a dielectric layer. A regrown GaN layer 221 is created. In one embodiment, regrown GaN layer is created after the regrowth mask 231 is deposited. The regrown GaN layer is created encapsulate the p-type block 211 and surface dopant with a contact gap covered by the regrowth mask 231. Subsequently, when regrowth mask 231 is removed, the contact gap created by the regrowth mask 231 provides an enhanced Ohmic contact with the deposited gate material.

In another novel aspect, a regrown barrier layer is created as step 204. In one embodiment, regrown GaN layer 221 is a barrier layer. In one embodiment, regrown GaN layer 221 is an anti-p-doping layer that blocks the counter doping to the lateral layer and the vertical channel. Regrown layer 221 buries counter doping surface magnesium (Mg) in the regrown layer 221 so the lateral channel is less resistive.

Steps 203 and step 204 are independent improvements that create an overall enhanced JFET. Steps 203 and 204 can be performed individually without one another. Alternatively, steps 203 and 204 are both performed to create a JFET with enhanced Ohmic contact and less resistive lateral channel.

Figure 3:
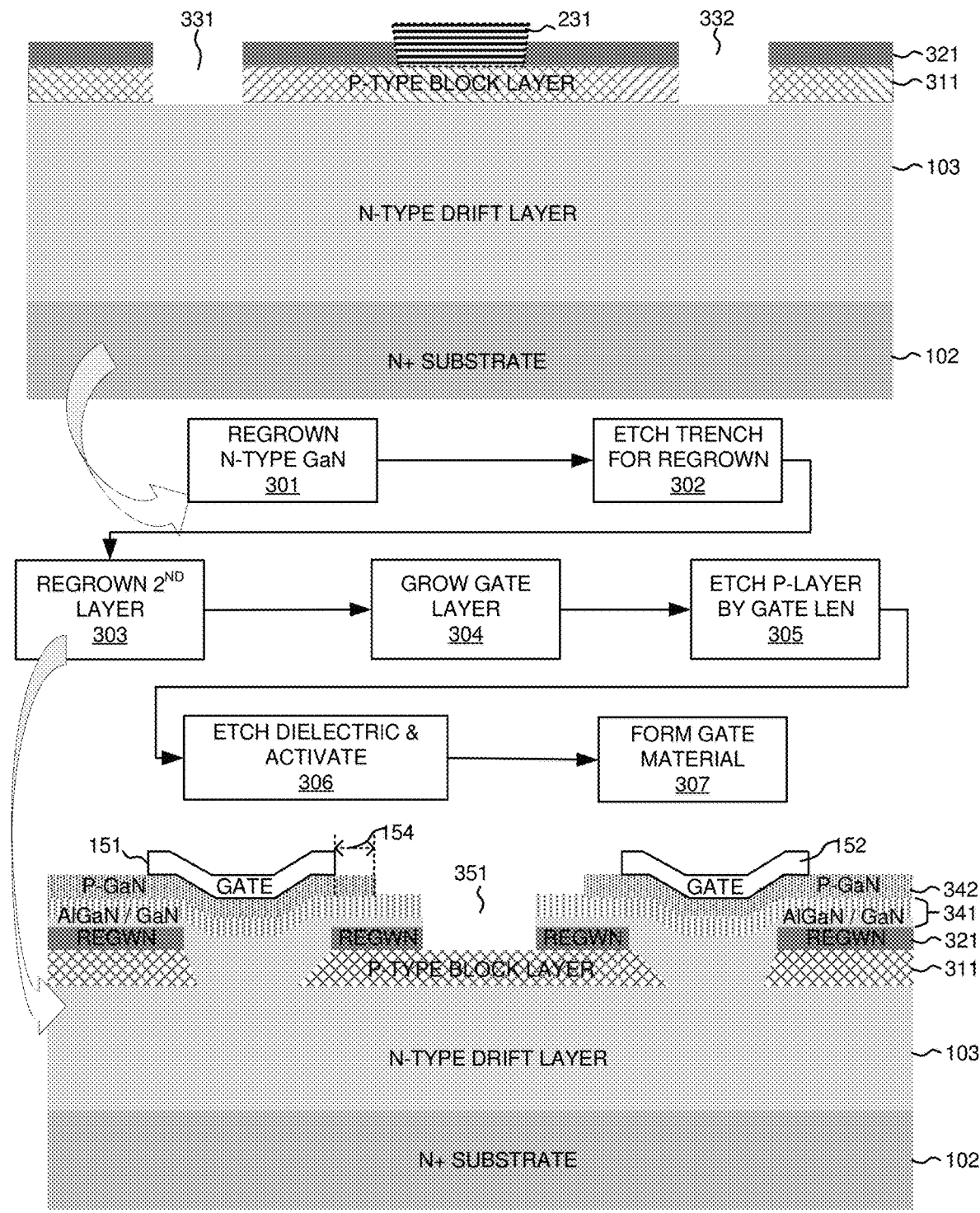
FIG. 3 illustrates exemplary diagrams of forming gate with enhanced Ohmic contact process in accordance with embodiments of the current invention.

FIG. 3 illustrates exemplary diagrams of forming gate with enhanced Ohmic contact process in accordance with embodiments of the current invention. Subsequent to epitaxial as-grown of the substrate layer 102 and the drift layer 103, p-type block layer is grown. In one embodiment, a regrown mask 231 is deposited on top of the drift layer 103 for enhanced Ohmic contact. At step 301, a regrown process deposits N-type GaN on top of the N-type drift layer 103. At step 302, trenches are etched. In one embodiment, where the regrown barrier layer is deposited over the p-type block layer, the trenches 331 and 332 are etched through the regrown layer and through the p-type block layer forming p-type block layer 311 with trenches 331 and 332 and regrown barrier layer 321 with trenches 331 and 332. In another embodiment, trenches are etched through the p-type block layer 103 before the regrowth. In yet another embodiment, the regrown barrier layer is deposited without the regrowth mask. Trenches are etched through the regrown layer and through the p-type block layer. In one embodiment, a second regrown layer is deposited over the first regrown layer 311 at step 303. In one embodiment, the second regrown regrows in the trenches 331 and 332 and forms n-type channel, and AlGaN/GaN 2d Gas channel 341. At step 304, a gate layer 342 is grown over the second grown layer 341. In one embodiment, gate layer 342 is a p-GaN layer. At step 305, the p-GaN layer is etched such that a predefined gate length 154 is attained. In one embodiment, at step 306, the regrowth mask is etched forming a contact gap 351. Both the gate layer and the p-type block layer are activated. At step 307, gate metal 151 and gate metal 152 are formed over the gate layer. Ohmic contact 153 is deposited in the gap in contact to the p-type block layer. In one novel aspect, the contact gap is created with the patterned regrowth. Compared to the traditional etching process, the patterned regrowth results in enhanced Ohmic contact.

Figure 4:
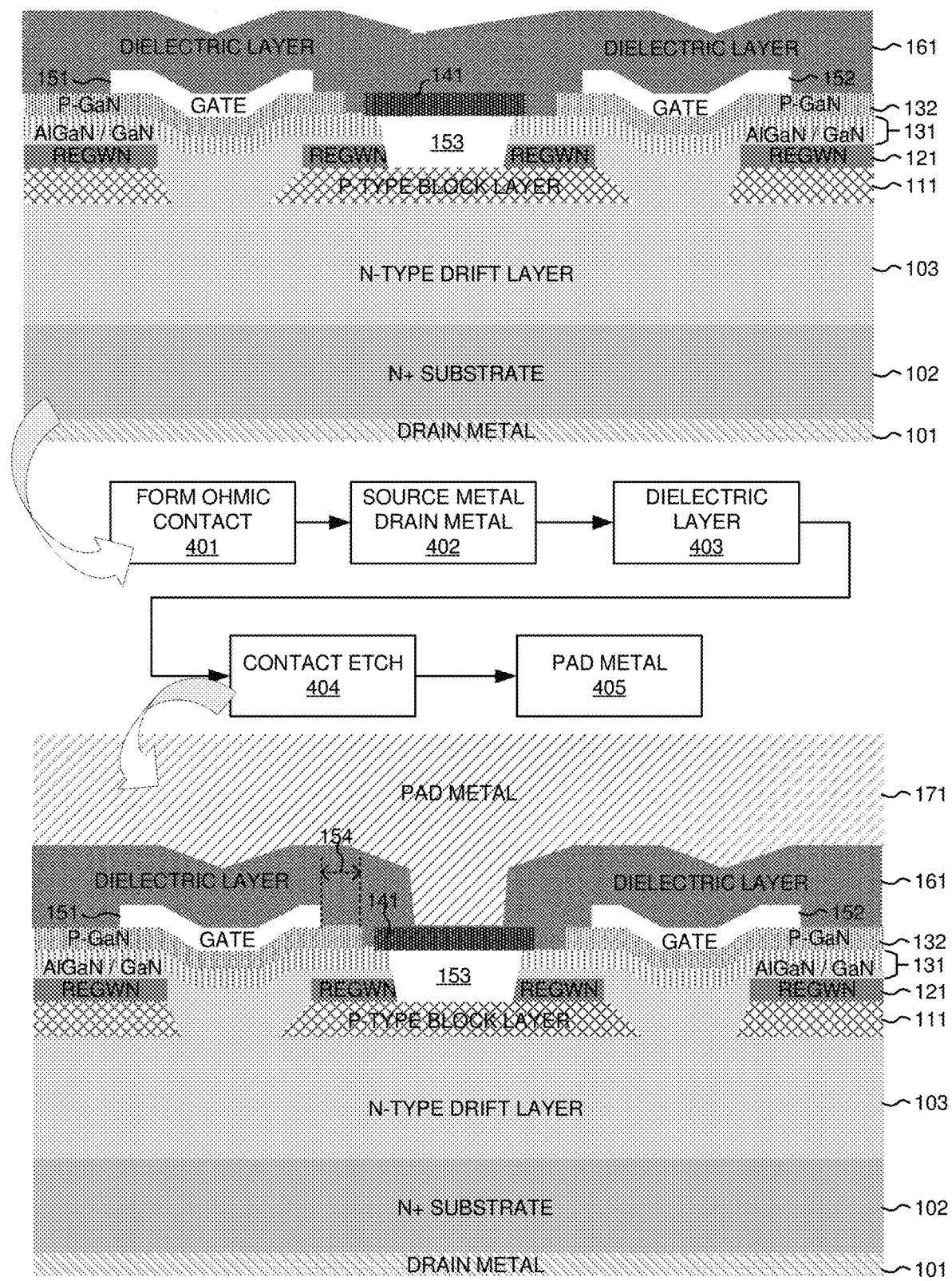
FIG. 4 illustrates exemplary diagrams of forming an enhanced Ohmic contact and a dielectric layer over the gate layer in accordance with embodiments of the current invention.

FIG. 4 illustrates exemplary diagrams of forming an enhanced Ohmic contact and a dielectric layer over the gate layer in accordance with embodiments of the current invention. In one novel aspect, a patterned regrowth is used. A contact gap is created by depositing a regrowth mask before the regrowth process and etching the regrowth mask after the regrowth. In one embodiment, the regrowth mask is a dielectric layer. At step 401, Ohmic contact 153 is created over the contact gap. At step 402, source metal and alloy 141 is deposited over the Ohmic contact 153 and the lateral channel layer. Drain metal 101 is deposited at the backside substrate 102. At step 403, a dielectric layer 161 is deposited over the gate layer. At step 404, a contact trench is etched through dielectric layer 161 to create a contact surface to the source gate 141. At step 405, pad metal 171 are deposited over dielectric layer 161 and through the trenches to be in contact with the source gate 141.

Figure 5:
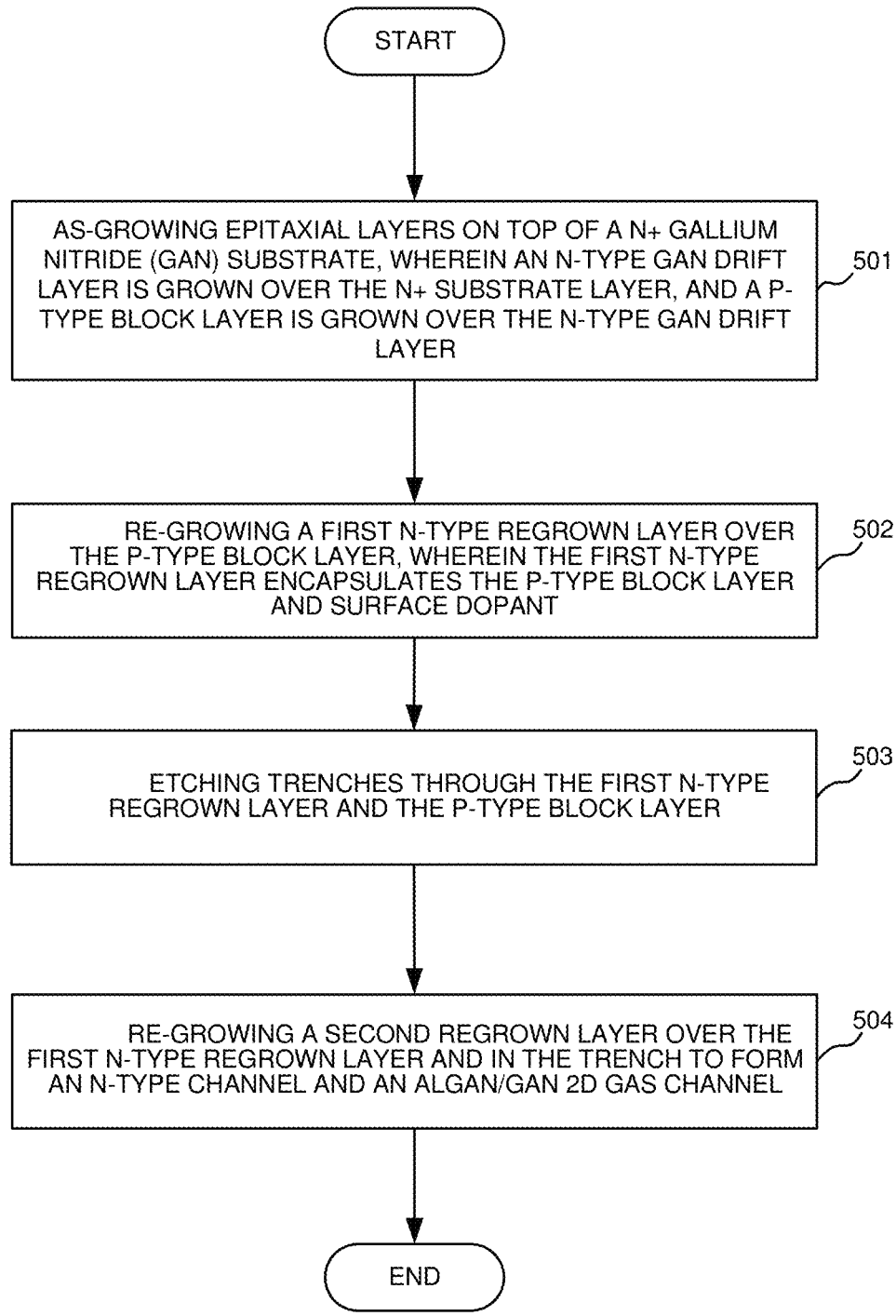
FIG. 5 illustrates an exemplary flow chart of the process with a barrier regrown layer for enhanced lateral channel performance in accordance with embodiments of the current invention.

FIG. 5 illustrates an exemplary flow chart of the process with a barrier regrown layer for enhanced lateral channel performance in accordance with embodiments of the current invention. Step 501 as-grows epitaxial layers on top of a N+ gallium nitride (GaN) substrate, wherein an N-type GaN drift layer is grown over the N+ substrate layer, and a P-type block layer is grown over the N-type GaN drift layer. Step 502 re-grows a first N-type regrown layer over the P-type block layer, wherein the first N-type regrown layer encapsulates the P-type block layer and surface dopant. Step 503 etches trenches through the first N-type regrown layer and the P-type block layer. Step 504 re-grows a second regrown layer over the first N-type regrown layer and in the trench to form an N-type channel and an AlGaN/GaN 2D Gas channel.

Figure 6:
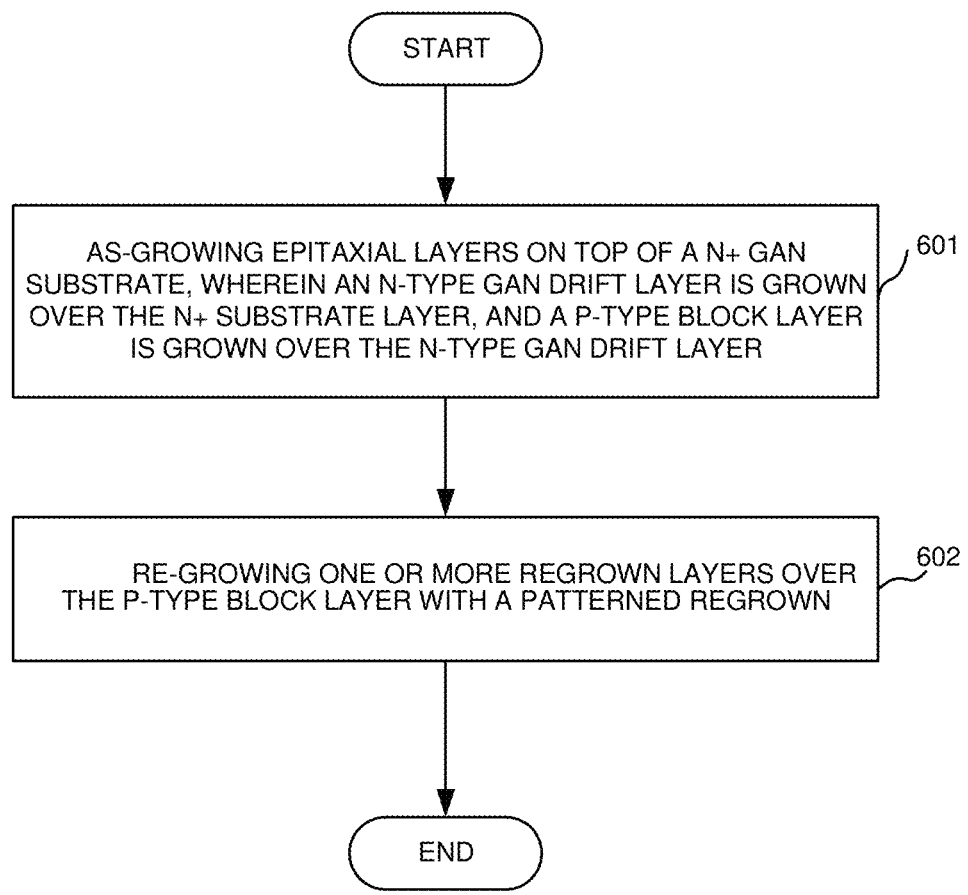
FIG. 6 illustrates an exemplary flow chart of the process with a patterned regrowth for enhanced Ohmic contact in accordance with embodiments of the current invention.

FIG. 6 illustrates an exemplary flow chart of the process with a patterned regrowth for enhanced Ohmic contact in accordance with embodiments of the current invention. Step 601 as-grows epitaxial layers on top of a N+ GaN substrate, wherein an N-type GaN drift layer is grown over the N+ substrate layer, and a P-type block layer is grown over the N-type GaN drift layer. Step 602 re-grows one or more regrown layers over the P-type block layer with a patterned regrown.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed:

1. A method, comprising:
    as-growing epitaxial layers on top of a N+ gallium nitride (GaN) substrate, wherein an N-type GaN drift layer is grown over the N+ substrate layer, and a P-type block layer is grown over the N-type GaN drift layer;
    re-growing a first N-type regrown layer over the P-type block layer, wherein the first N-type regrown layer encapsulates the P-type block layer and surface dopant;
    etching trenches through the first N-type regrown layer and the P-type block layer; and
    re-growing a second regrown layer over the first N-type regrown layer and in the trench to form an N-type channel and an AlGaN/GaN 2D Gas channel.

2. The method of claim 1, wherein the re-growing the first N-type regrown layer is a patterned regrown.

3. The method of claim 2, wherein the patterned regrown is performed by depositing a dielectric layer over a part of the P-type block layer before re-growing the first N-type regrown layer.

4. The method claim 1, wherein the first regrown N-type layer is an anti-p-doping layer.

5. The method of claim 1, wherein the second regrown layer is an aluminum gallium nitride (AlGaN)/gallium nitride (GaN) layer.

6. The method of claim 1, further comprising:
    growing a second P-type layer over the second regrown layer;
    depositing gate metals over the second P-type layer; and
    depositing a gate metal over the P-type block layer over a contact gap of the first regrown N-type layer and the second regrown layer.

7. The method of claim 6, wherein the contact gap is formed by removing a dielectric regrowth mask deposited over the P-type block layer before the regrown of the first regrown N-type layer.

8. The method of claim 6, further comprising:
    depositing a dielectric layer over the second P-type layer and gate metals, wherein the dielectric layer protects the second p-type layer during the apparatus processing, resulting in Ohmic source contact over the buried P-type block layer.

9. A method, comprising:
    as-growing epitaxial layers on top of a N+ GaN substrate, wherein an N-type GaN drift layer is grown over the N+ substrate layer, and a P-type block layer is grown over the N-type GaN drift layer; and
    re-growing one or more regrown layers over the P-type block layer with a patterned regrown by re-growing a first N-type regrown layer encapsulating the P-type block layer and surface dopant, etching trench through the first N-type regrown layer and the P-type block layer, and re-growing a second regrown layer over the first N-type regrown layer and in the trench to form an N-type channel and an AlGaN/GaN 2D Gas channel.

10. The method of claim 9, wherein the patterned regrown is performed by depositing a dielectric layer over the P-type block layer before the regrown process.

11. The method of claim 9, wherein the first regrown N-type layer is an anti-p-doping layer.

12. The method of claim 9, further comprising:
    growing a second P-type layer over the second regrown layer;
    depositing gate metals over the second P-type layer; and
    depositing a gate metal over the P-type block layer over a contact gap of the first regrown N-type layer and the second regrown layer.

13. The method of claim 12, further comprising:
depositing a dielectric layer over the second P-type layer and gate metals, wherein the dielectric layer protects the second p-type layer during the apparatus processing, resulting in Ohmic source contact over the buried P-type block layer.

* * * * *